United States Patent
Schatzberger

(10) Patent No.: US 9,306,493 B2
(45) Date of Patent: Apr. 5, 2016

(54) OSCILLATOR CIRCUIT

(71) Applicant: ams AG, Unterpremstaetten (AT)

(72) Inventor: Gregor Schatzberger, Graz (AT)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 14/572,727

(22) Filed: Dec. 16, 2014

(65) Prior Publication Data

US 2015/0171791 A1 Jun. 18, 2015

(30) Foreign Application Priority Data

Dec. 17, 2013 (EP) .................................... 13197700

(51) Int. Cl.
  *H03K 3/26* (2006.01)
  *H03B 5/12* (2006.01)
  *H03K 4/501* (2006.01)

(52) U.S. Cl.
  CPC ............... *H03B 5/1228* (2013.01); *H03K 3/26* (2013.01); *H03K 4/501* (2013.01)

(58) Field of Classification Search
  CPC ........ H03B 1/00; H03B 5/1228; H03K 4/501; H03K 3/26
  USPC ............................... 331/111, 143, 177 V, 167
  See application file for complete search history.

(56) References Cited

U.S. PATENT DOCUMENTS

| | | | |
|---|---|---|---|
| 4,623,851 A * | 11/1986 | Abou | 331/111 |
| 6,646,513 B1 | 11/2003 | Neidorff | |
| 6,867,657 B2 | 3/2005 | Hollinger et al. | |
| 8,198,947 B2 | 6/2012 | Schatzberger | |
| 8,232,846 B1 | 7/2012 | De Vita et al. | |
| 2007/0241832 A1 | 10/2007 | Nervegna | |
| 2011/0140754 A1 | 6/2011 | Tokunaga et al. | |
| 2012/0126906 A1 | 5/2012 | Choe et al. | |
| 2012/0182080 A1 | 7/2012 | Sinitsky et al. | |

* cited by examiner

*Primary Examiner* — Arnold Kinkead
(74) *Attorney, Agent, or Firm* — McDermott Will & Emery LLP

(57) ABSTRACT

An oscillator circuit comprises a current path including a capacitor having a first side and a second side, wherein each of the first and second side of the capacitor is selectively connectable to at least a first supply terminal to apply a first voltage potential or a second supply terminal to apply a second voltage potential. The oscillator circuit comprises a comparator having a first input terminal being selectively connectable to the first or the second side of the capacitor, and a second input terminal being connected to a terminal to apply a reference voltage. An output signal of the oscillator circuit is generated in dependence on a comparator output signal of the comparator.

13 Claims, 6 Drawing Sheets

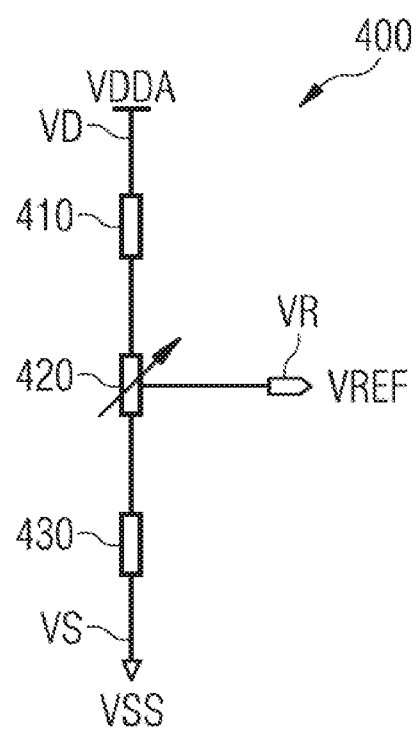

OSCILLATOR CIRCUIT

TECHNICAL FIELD

The invention relates to an oscillator circuit which may be used in integrated circuit design.

BACKGROUND

Oscillator circuits play a key role in integrated circuit design. Almost all digital cores needs, for example, a clock generator to enable the operation of the circuit. There are many different possibilities for designing an oscillator. A precise oscillator may be built up with quartz. However, a quartz is an expensive external component which cannot be integrated on the same silicon as the rest of the circuitry. Another drawback of such quartz oscillators is the limited temperature range, for example a temperature range from −40° to +125° C. However, many applications need an extended temperature range from, for example, −40° to +170° C.

To make an oscillator circuit inexpensive, external components should be avoided. A CMOS oscillator may be embedded in an integrated circuit design. There are different ways to design fully integrated CMOS oscillators. The most important parameters are a low temperature drift of the output frequency, a low power consumption, a low clock jitter, a good power supply rejection ratio, a low voltage ripple on the power supply, a low charge injection in the substrate, and a small area consumption.

There is a need to provide an oscillator circuit which enables a reliable generation of a stable output frequency in addition to lower power and small area consumption.

SUMMARY

An embodiment of an oscillator circuit with the above-mentioned qualities is specified in present claim 1. According to a possible embodiment of the oscillator circuit, the oscillator comprises at least a first supply terminal to apply a first voltage potential, at least a second supply terminal to apply a second voltage potential being different from the first voltage potential, an output terminal to output an output signal of the oscillator circuit and a terminal to apply a reference voltage. The oscillator circuit further comprises a capacitor having a first side and a second side, wherein each of the first and second side of the capacitor is selectively connectable to the at least one first or second supply terminal. The oscillator circuit further comprises a comparator having a first input terminal to apply a first input signal, a second input terminal to apply a second input signal and an output terminal to generate a comparator output signal. The first input terminal of the comparator is selectively connectable to the first or the second side of the capacitor. The second input terminal of the comparator is connected to the terminal to apply the reference voltage. The comparator is configured to generate the comparator output signal in dependence on the comparing of the first and second input signal of the comparator. The output terminal of the comparator is coupled to the output terminal of the oscillator.

The proposed oscillator circuit has a low power consumption, a low noise, a low jitter and allows the generation of the output signal with a temperature-stable output frequency. The principle of the oscillator is based on a resistor switched capacitor approach comprising a current path which is selectively, particularly alternately, connectable at both ends to the at least one first or second supply terminal. The current path may comprise only one capacitor. One side of the capacitor may be coupled via a first resistor to a first controllable switch which selectively connects the first side of the capacitor via the first resistor to the at least one first or second supply terminal. A second side of the capacitor may be coupled via a second resistor to a second controllable switch being configured to selectively couple the second side of the capacitor via the second resistor to the at least one first or second supply terminal.

According to a possible embodiment, one side of the capacitor may be coupled via a first resistor to a first controllable switch which alternately connects the first side of the capacitor via the first resistor to the at least one first and second supply terminal. A second side of the capacitor may be coupled via a second resistor to a second controllable switch being configured to alternately couple the second side of the capacitor via the second resistor to the at least one first and second supply terminal.

The capacitor may be charged via the two resistors from a first side until the level of the reference voltage is reached. The oscillator circuit may comprise a comparator followed by a flip-flop circuit to detect the point in time when a level of a voltage caused by the charging of the capacitor exceeds the level of the reference voltage. In this case, a control circuit may switch the current path, including the resistors and the capacitor, in relation to the at least one first and second voltage potential in the opposite direction. The capacitor is recharged from a second side until the level of the reference voltage is reached again. When the comparator detects the rising of the level of the voltage at the capacitor above the level of the reference voltage, the current path including the capacitor and the resistors is switched back to its original position in relation to the at least one first and second voltage potential by means of the first and second controllable switches, and the capacitor is recharged again from the other side of the current path.

The output frequency of the oscillator depends on the time constant of the current path including the capacitor and the resistors, the reference voltage and the comparator delay. The capacitor may be configured as a capacitor having a trimmable capacitance to compensate process variations of the capacitance of the capacitor, the resistances of resistors and the level of the reference voltage, and to enable a correct setting of the output frequency of the output signal.

According to another embodiment, at least one of the first and second resistors of the current path may be configured as resistors having a trimmable resistance. According to another embodiment, it is also possible to provide the capacitor and the resistors as trimmable components to adjust the output frequency of the output signal to its correct value. If the resistors are involved in the trimming process of the output frequency of the output signal both resistors must be trimmed in the same way to avoid duty cycle changes of the oscillator output. According to another embodiment of the oscillator circuit, it is possible to adjust the output frequency of the oscillator by trimming the level of the reference voltage.

It is to be understood that both the foregoing general description and the following detailed description present embodiments and are intended to provide an overview or a framework for understanding the nature and character of the disclosure. The accompanying drawings are included to provide a further understanding, and are incorporated into and constitute a part of this specification. The drawings illustrate various embodiments and, together with the description, serve to explain the principles and operation of the concepts disclosed.

BRIEF DESCRIPTION OF THE DRAWINGS

FIG. 6 shows an embodiment of a voltage-generating circuit to generate a reference voltage of the oscillator circuit.

DETAILED DESCRIPTION

Figure 1:
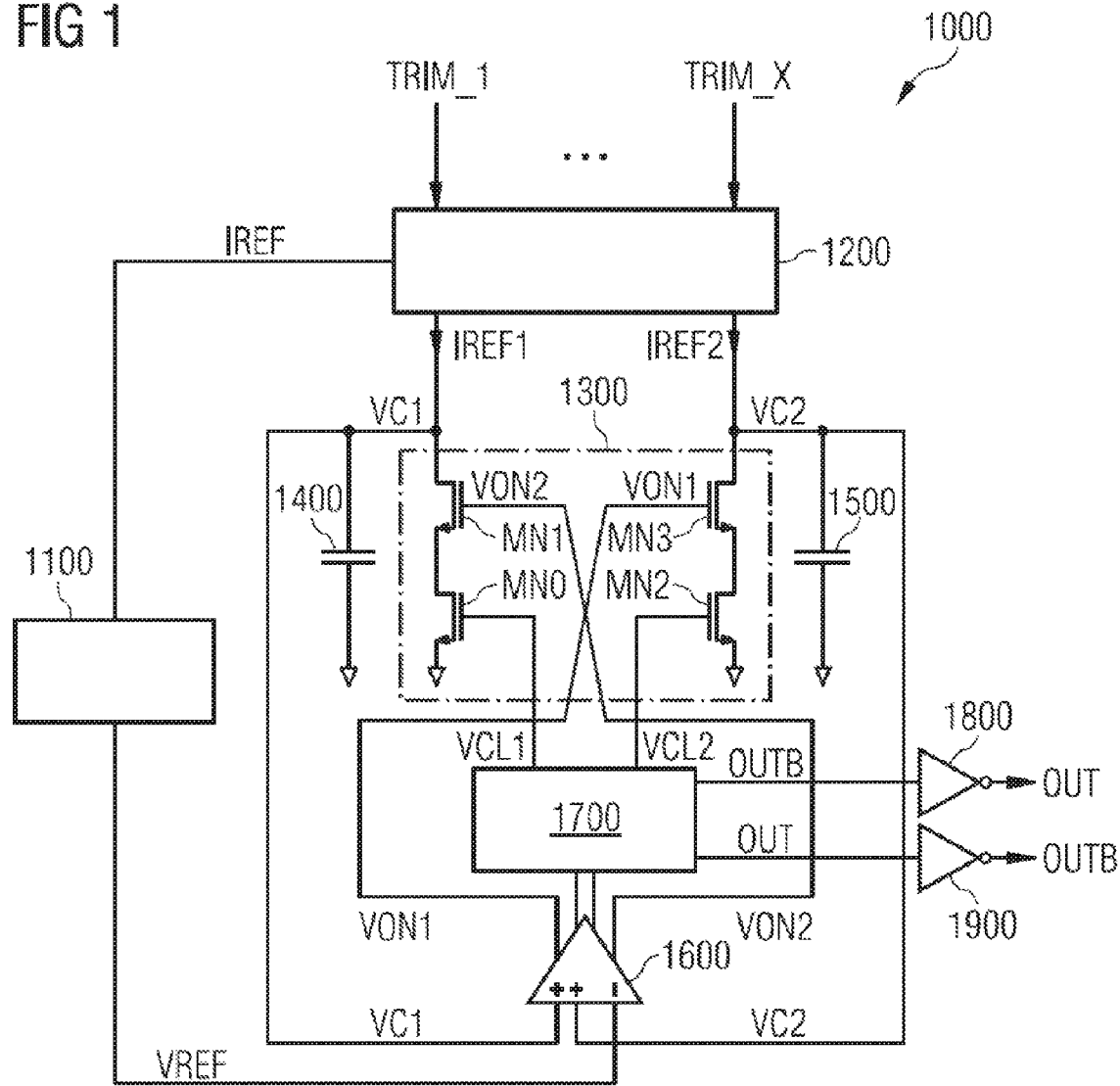
FIG. 1 shows an embodiment of an oscillator circuit.

FIG. 1 shows an embodiment of an oscillator circuit 1000 comprising a circuit 1100 to generate a temperature-compensated reference voltage VREF and a temperature-compensated reference current IREF being nearly independent on temperature changes. The oscillator circuit 1000 further comprises a current generation circuit 1200 which generates a reference current IREF1 and IREF2 in dependence on the temperature-compensated reference current IREF and trimming input signals TRIM_1, . . . , TRIM_X.

The oscillator circuit 1000 further comprises a circuit block 1300 with four CMOS switches MN0, . . . , MN3. The current generation circuit 1200 comprises a first current source which generates the reference current IREF1 being applied to the circuit block 1300 and a capacitor 1400 of the oscillator circuit. The current generation circuit 1200 further comprises a second current source which generates the reference current IREF2 which is applied to circuit block 1300 and a capacitor 1500 of the oscillator circuit. A voltage VC1 dropping at the capacitor 1400 and a voltage VC2 dropping at the capacitor 1500 are applied to an input side of a comparator 1600 of the oscillator circuit. The temperature-compensated reference voltage VREF generated by the reference voltage generation circuit 1100 is also applied to the input side of the comparator 1600.

An output side of the comparator 1600 is connected to an RS-flip-flop 1700 of the oscillator circuit which generates output voltages VCL1 and VCL2. The output voltage VCL1 is applied to a control terminal of CMOS switch MN0. The output voltage VCL2 is applied to a control terminal of CMOS switch MN2. An output voltage VON1 generated by the comparator 1600 in dependence on the voltages VC1, VC2 and the temperature-compensated reference voltage VREF is applied to a control terminal of CMOS switch MN3. An output voltage VON2 generated by the comparator 1600 in dependence on the voltages VC1, VC2 and the temperature-compensated reference voltage VREF is applied to a control terminal of CMOS switch MN1. The RS-flip-flop 1700 generates output signals OUTB, OUT which are transferred via inverters 1800, 1900 to output terminals of the oscillator circuit to generate oscillator output signals OUT, OUTB.

The oscillator circuit shown in FIG. 1 uses a temperature-stable reference voltage VREF and a temperature-stable reference current IREF which are the input signals of the I-C-oscillator formed by the two capacitors 1400, 1500, the comparator 1600, the RS-flip-flop circuit 1700 and the four CMOS switches MN0, . . . , MN3. The basic idea of this implementation of an oscillator is that the first capacitor 1400 is loaded with the first reference current IREF1 while the second capacitor 1500 is discharged. If the level of the voltage VC1 on the first capacitor 1400 reaches the level of the reference voltage VREF, the second capacitor 1500 starts to load immediately triggered directly by the comparator 1600 while discharging of the first capacitor 1400 starts after the output of the flip-flop circuit 1700 changes its logic state. The second capacitor 1500 is then loaded until the level of the voltage VC2 reaches the level of the reference voltage VREF.

Figure 2:
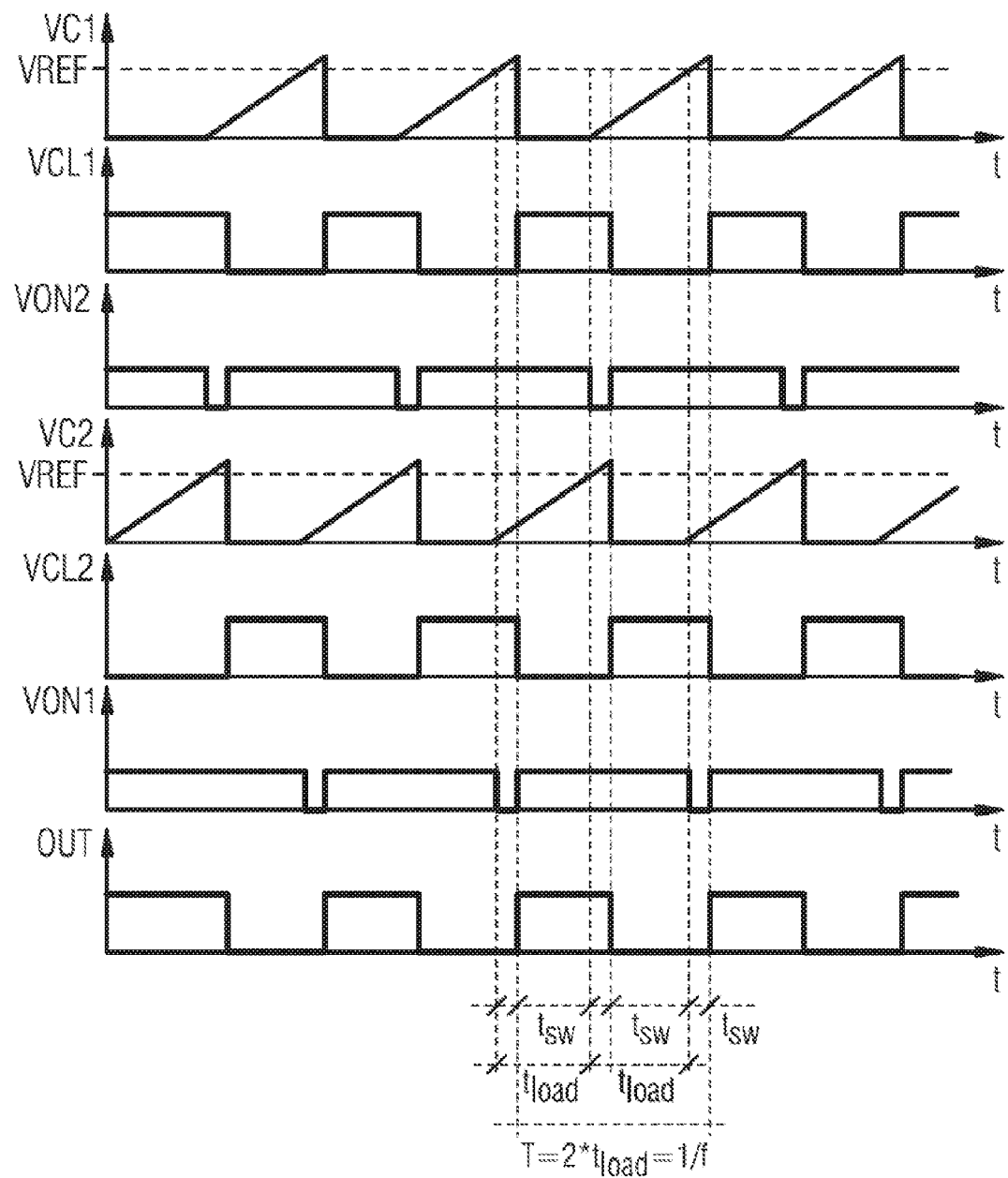
FIG. 2 shows diagrams with courses of voltage potentials at nodes of the oscillator circuit.

FIG. 2 shows a timing diagram of voltage potentials at different nodes of the oscillator circuit 1000 illustrated in FIG. 1. As shown in FIG. 2, pulses of the voltage potentials VON1 VON2 are generated by a time distance $t_{SW}$. A time period T or the output frequency f of the output signal OUT of the oscillator circuit may be expressed by the formula $T=2t^*_{load}=1/f$, wherein the time $t_{load}$ is the time period in which capacitor 1400 is charged with the reference current IREF1 in a first phase of the operation of the oscillator circuit and the time distance in which capacitor 1500 is charged with the reference current IREF2 in a second phase of the operation of the oscillator circuit.

The advantages of this implementation of an oscillator circuit are a nearly temperature-stable output frequency of the output signal. The oscillator circuit has a low ripple on the power supply because both current sources of the current generation circuit 1200 charging the capacitors 1400, 1500 are permanently providing current. The current source either charges a capacitor or the current source is shorted to ground. The speed of the comparator 1600 and the RS-flip-flop circuit 1700 is not that critical because the charge phase of the capacitors is triggered from a differential stage of the comparator which results in a low current consumption of the comparator. All relevant structures inside the oscillator are cascaded so that the power supply rejection has a good performance.

Figure 3:
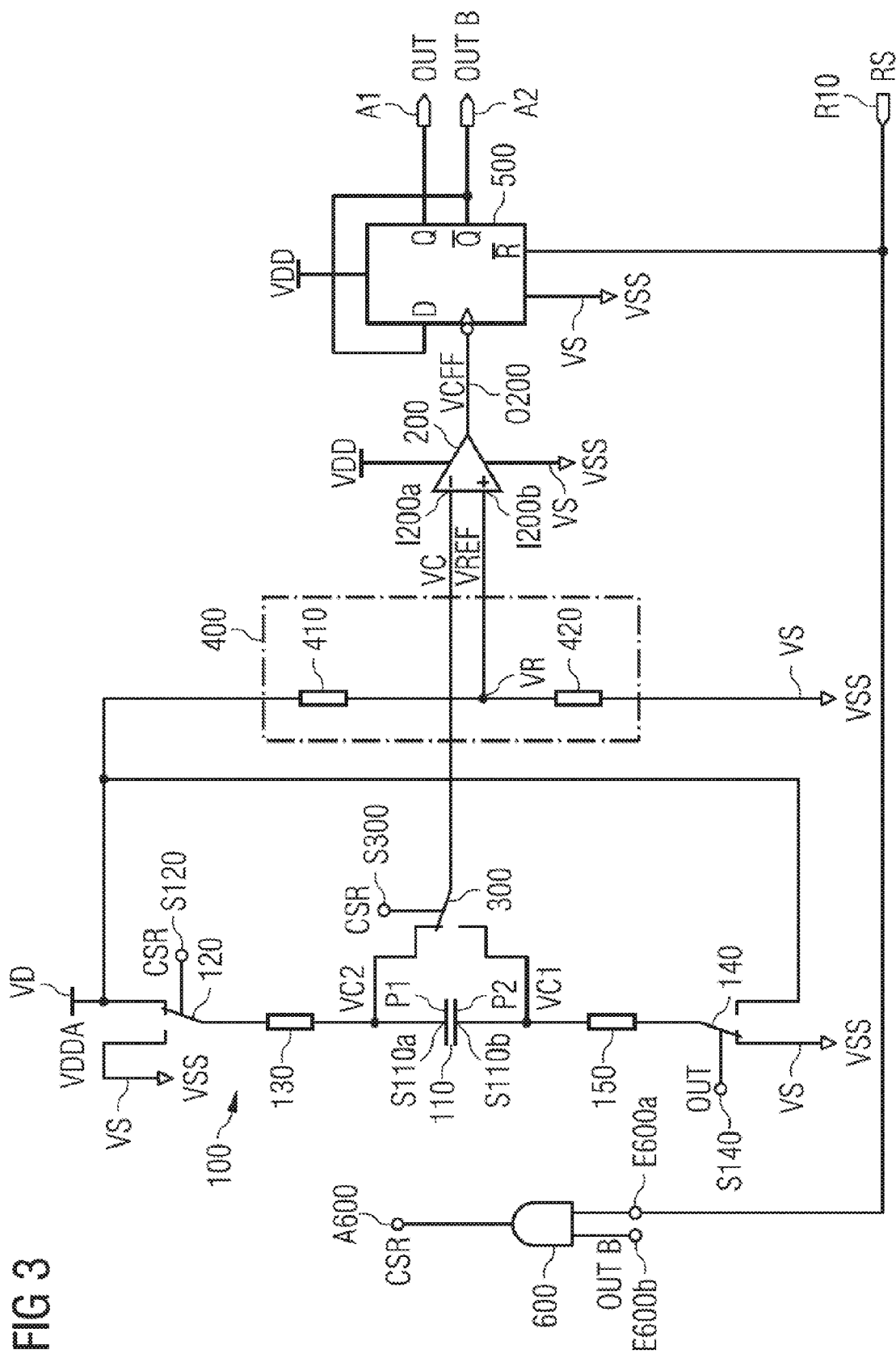
FIG. 3 shows another embodiment of an oscillator circuit.

FIG. 3 shows another embodiment of an oscillator circuit 10 having a lower power consumption and a smaller area consumption compared to the oscillator circuit 1000. The oscillator circuit 10 comprises at least a first supply terminal VD to apply a first voltage potential VDDA, at least a second supply terminal VS to apply a second voltage potential VSS being different from the first voltage potential VDDA. The first voltage potential VDDA may be a positive supply potential in relation to a ground potential, and the second voltage potential VSS may be a negative supply potential in relation to a ground potential. The oscillator circuit 10 further comprise an output terminal A1, A2 to output an output signal OUT, OUTB of the oscillator circuit 10, and a terminal VR to apply a reference voltage VREF. The oscillator circuit 10 comprises a capacitor 110 having a first side S110a and a second side S110b, wherein each of the first and second side S110a, S110b of the capacitor 110 is selectively connectable to the at least one first or second supply terminal VD, VS. The oscillator circuit additionally comprises a comparator 200 having a first input terminal I200a to apply a first input signal VC, a second input terminal I200b to apply a second input signal VREF and an output terminal O200 to generate a comparator output signal VCFF.

According to the embodiment of the oscillator circuit 10 shown in FIG. 3, the first input terminal I200a of the comparator 200 is selectively connectable to the first or the second side S110a, S110b of the capacitor 110. The first input terminal I200a of the comparator 200 may, for example, be alternately connectable to the first or the second side S110a, S110b of the capacitor 110. The second input terminal I200b of the comparator 200 is connected to the terminal VR to apply the reference voltage VREF. The comparator 200 is configured to generate the comparator output signal VCFF in dependence on the comparison of the first and second input signal VC, VREF of the comparator. The output terminal O200 of the comparator 200 is coupled to the output terminals A1, A2 of the oscillator circuit 10.

The oscillator circuit 10 may comprise a first controllable switch 120 being coupled to the first side S110a of the capacitor 110. The first controllable switch 120 may be configured to selectively couple the first side S110a of the capacitor 110 to the at least one first or second supply terminal VD, VS. The first controllable switch 120 may, for example, be configured to alternately couple the first side S110a of the capacitor 110 to the at least one first and second supply terminal VD, VS. The oscillator circuit 10 may further comprise a first resistor 130 being arranged between the first side S110a of the capacitor 110 and the first controllable switch 120. The first side S110a of the capacitor 110 is selectively, for example alternately, connectable to the at least one first and second supply terminal VD, VS via the first resistor 130. The first controllable switch 120 may be configured to selectively couple the first side S110a of the capacitor 110 to the at least one first or second supply terminal VD, VS via the first resistor 130. The first controllable switch 120 may, for example, be configured to alternately couple the first side S110a of the capacitor 110 to the at least one first and second supply terminal VD, VS via the first resistor 130.

According to an embodiment of the oscillator circuit 10, a second controllable switch 140 is provided and coupled to the second side S110b of the capacitor 110. The second controllable switch 140 is configured to selectively couple the second side S110b of the capacitor 110 to the at least one first or second supply terminal VD, VS. The second controllable switch 140 may, for example, be configured to selectively couple the second side S110b of the capacitor 110 to the at least one first and second supply terminal VD, VS. The oscillator circuit may comprise a second resistor 150 being arranged between the second side S110b of the capacitor 110 and the second controllable switch 140. The second side S110b of the capacitor 110 is selectively, for example alternately, connectable to the at least one first and second supply terminal VD, VS via the second resistor 150. The second controllable switch 140 may be configured to selectively couple the second side S110b of the capacitor 110 to the at least one first or second supply terminal VD, VS, for example alternately couple the second side S110b of the capacitor 110 to the at least first and second supply terminal VD, VS, via the second resistor 150.

The capacitor 110 has a first plate P1 and a second plate P2 being separated from each other by a dielectric medium to store a charge in the capacitor 110. The first side S110a of the capacitor 110 is connected to the first plate P1 of the capacitor 110. The second side S110b of the capacitor 110 is connected to the second plate P2 of the capacitor.

The oscillator circuit 10 may comprise a third controllable switch 300 being connected to the first input terminal I200a of the comparator 200. The third controllable switch 300 is configured to selectively couple the first or the second side S110a, S110b of the capacitor 110, for example to alternately couple the first and the second side S110a, S110b of the capacitor 100, to the first input terminal I200a of the comparator 200.

The oscillator circuit 10 may further comprise a voltage-generating circuit 400 to generate the reference voltage VREF. The voltage-generating circuit 400 is configured to generate the reference voltage VREF in dependence on the first voltage potential VDDA. The voltage-generating circuit 400 is arranged between the at least one first supply terminal VD and the at least one second supply terminal VS. The voltage-generating circuit may be configured as a voltage divider circuit, and may comprise at least a first and a second resistor 410, 420.

The oscillator circuit 10 may further comprise a flip-flop circuit 500 to generate the output signal OUT, OUTB of the oscillator. The flip-flop circuit 500 is arranged between the comparator 200 and the output terminal A1, A2 of the oscillator. The comparator 200 and the flip-flop circuit 500 may be supplied by a positive supply potential VDD and the negative supply potential VSS for operation, respectively in relation to a ground potential. The supply potential VDDA applied to the at least one first supply terminal VD may be a positive analogue supply potential.

The configuration of the oscillator circuit 10 is based on providing a current path 100 comprising only one capacitor 110. The current path 100 may further comprises the two resistors 130 and 150. The resistors 130 and 140 may be configured as equal resistors having the same resistance. The current path is connected via the controllable switches 120, 140 to the first voltage potential VDDA and to the second voltage potential VSS. The first input terminal I200a of the comparator 200 may be configured as a negative input of the comparator which may be switched via the controllable switch 300 from one plate P1, P2 of the capacitor 110 to the other plate P2, P1 of the capacitor. The second input terminal I200b of the comparator 200 may be configured as a positive input of the comparator which is connected to the terminal VR to apply reference voltage VREF.

The oscillator circuit 10 comprises a reset input terminal R10 to apply a reset signal RS. The flip-flop circuit 500 comprises a reset input terminal which is connected to the reset input terminal R10 of the oscillator, so that the reset signal RS is applied to the flip-flop circuit 500. The oscillator circuit 10 comprises a control circuit 600 to generate a control signal CSR at an output terminal A600 to control the switching states of the controllable switches 120 and 300. The control circuit 600 is configured to generate the control signal CSR in dependence on the external reset signal RS and the output signal OUT, OUTB of the oscillator. According to the embodiment shown in FIG. 3, the inverted output signal OUTB of the output signal OUT is applied to the control circuit 600. The control circuit 600 may be configured as an AND gate having an input terminal E600a to apply the reset signal RS and an input terminal E600b to apply the output signal OUTB of the oscillator circuit.

Before the oscillator circuit 10 starts working, i.e. generates the output signal OUT, OUTB with the output frequency, the reset signal RS is applied to the reset input terminal R10. The reset signal RS effects that the flip-flop circuit 500 is cleared so that the output signal OUT is set to the second voltage potential VSS, for example the negative power supply potential, and the inverted output signal OUTB is set to the voltage potential VDD, for example the positive power supply potential. The control circuit 600 generates the control signal CSR such that the controllable switch 120 is connected to the at least one second supply terminal VS. The control signal CSR further controls the controllable switch 300 such that the input terminal I200a of the comparator 200 is connected to the first side S110a of the capacitor 110. The output signal OUT is used as a control signal for the controllable switch 140 to connect the controllable switch to the at least one second supply terminal VS to apply the second voltage potential VSS. In this state of the oscillator circuit the capacitor 110 is discharged via the resistors 130, 150.

In order to release the oscillator circuit 10 to generate the oscillating output signals OUT, OUTB, the level of the reset signal RS may be changed, for example from the negative power supply VSS to the positive power supply VDD. The change of the level of the reset signal RS causes that the control circuit 600 generates the control signal CSR such that during a first time period the first controllable switch 120 connects the first side S110*a* of the capacitor 110 to the at least one first supply terminal VD, and the flip-flop circuit 500 is cleared which means that the output signal OUT is generated with the second voltage potential VSS. The third controllable switch 300 connects the first input terminal I200*a* of the comparator 200 to the first side S110*a* of the capacitor 110. The second controllable switch 140 is kept in its state and connects the second side S110*b* of the capacitor 110 to the at least one second supply terminal VS.

In this configuration of the oscillator circuit 10 during the first time period, the capacitor 110 is loaded via the resistors 130 and 150 until the level of the voltage potential VC at the first input terminal I200*a* of the comparator 200 becomes higher than the level of the reference voltage VREF at the second input terminal I200*b* of the comparator. The comparator 200 detects this event and is triggering the flip-flop circuit 500 such that the logic state of the output signals OUT changes its state, for example from the negative power supply potential VSS to the positive power supply potential VDD, and the inverted output signal OUTB changes its state from the positive power supply potential VDD to the negative power supply potential VSS.

The change of the state of the inverted output signal OUTB causes that the control circuit 600 generates the control signal CSR such that in a subsequent second time period the first controllable switch 120 connects the first side S110*a* of the capacitor 110 to the at least one second supply terminal VS, and the controllable switch 300 connects the first input terminal I200*a* of the comparator 200 to the second side S110*b* of the capacitor 110. The output signal OUT is used to connect the second side S110*b* of the capacitor 110 to the first supply terminal VD by means of the controllable switch 140.

During the second time period the first input terminal I200*a* of the comparator 200 is connected to the second side S110*b* of the capacitor 110. The potential at the first input terminal I200*a* then jumps to a level VC=VDDA/2−(VREF−VDDA/2). A new integration starts and the capacitor 110 is charged again via the resistors 130, 150 until the level of the voltage potential VC at the first input terminal I200*a* of the comparator becomes higher than the level of the reference voltage VREF, and the oscillator switches back to its original state.

Figure 4:
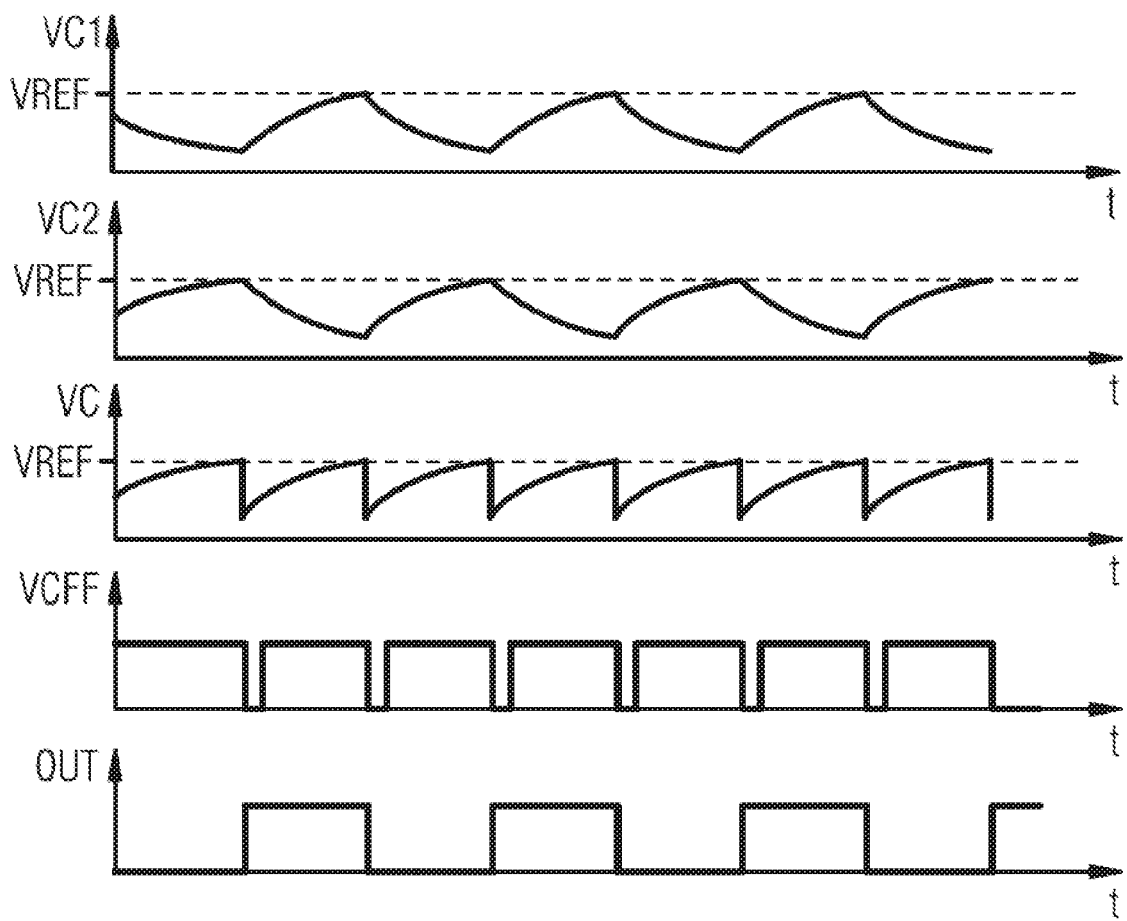
FIG. 4 shows diagrams of courses of voltage potentials at nodes of the oscillator circuit.

FIG. 4 shows timing diagrams of courses of the levels of the voltage potential VC1 at the second side S110*b* of capacitor 110, the voltage potential VC2 at the first side S110*a* of capacitor 110, the voltage potential VC at the input terminal I200*a* of comparator 200, the comparator output signal VCFF and the output signal OUT of the oscillator circuit during consecutive first and second operational states of the oscillator circuit 10.

During each first operational state of the oscillator circuit the first controllable switch 120 connects the first side S110*a* of capacitor 110 via the resistor 130 to the first voltage potential VDDA, the second controllable switch 140 connects the second side S110*b* of the capacitor 110 via resistor 150 to the second voltage potential VSS, and the third controllable switch 300 connects the input terminal I200*a* of the comparator 200 to the first side S110*a* of capacitor 110. During each first operational state of the oscillator circuit 10 the level of the voltage potential VC1 is lowered while the level of the voltage potential VC2, VC is increased until the level of the reference voltage VREF is reached. If the comparator 200 detects that the level of the voltage potential VC has reached the level of the reference voltage VREF, the comparator output signal VCFF changes its state. The comparator 200 generates a falling edge of the comparator output signal VCFF, and the flip-flop circuit 500 generates a rising edge of the output signal OUT.

After the voltage potential VC2 has reached the level of the reference voltage VREF, the oscillator circuit 10 is operated in the second operational state. During each second operational state following each first operational state the controllable switch 120 connects the first side S110*a* of capacitor 110 via resistor 130 to the second voltage potential VSS, and the second controllable switch 140 connects the second side S110*b* of the capacitor 110 via the resistor 150 to the first voltage potential VDDA. The controllable switch 300 connects the first input terminal I200*a* of the comparator 200 to the second side S110*b* of capacitor 110.

During each second operational state of the oscillator circuit 10 the level of the voltage potential VC1 at the second side S110*b* of capacitor 110 and the level of the voltage potential VC at the input terminal I200*a* of the comparator 200 rises while the voltage potential VC2 at the first side S110*a* of capacitor 110 decreases. If the comparator circuit 200 detects that the level of the voltage potential VC2, VC reaches the level of the reference voltage VREF, the comparator output signal VCFF is generated with a falling edge which causes the flip-flop circuit 500 to generate a falling edge of the output signal OUT.

The charging and discharging of the capacitor 110 may be symmetrical around a potential of VDDA/2. To compensate the dependence of the frequency of the output signal on the first voltage potential VDDA, the reference voltage VREF is generated in dependence on the first voltage potential VDDA. This is implemented according to FIG. 3 by using a voltage generating circuit 400 embodied accordingly. The voltage generating circuit may be embodied as a resistor divider comprising resistors 410 and 420. The level of the reference voltage VREF must be higher than a level of VDDA/2 to enable a proper function of the oscillator circuit. The resistance of resistor 420 may be two times higher than the resistance of the resistor 410.

It is possible to lower the first (analogue) voltage potential VDDA to a smaller value than the positive supply potential VDD which is used to operate the comparator 200 and the flip-flop circuit 500 to enable lower power consumption. The power consumption of the oscillator circuit 10 is lower compared to the configuration of the oscillator circuit 1000 shown in FIG. 1 by nearly 50%, because according to the embodiment of the oscillator circuit 10 only one capacitor 110 is charged and the comparator 200 is less complex in comparison to the comparator 1600 of oscillator circuit 1000.

The area needed for the oscillator circuit 10 depends on the available resistor options in the process. If a resistor with a high ohm/square is available, the area needed is much smaller compared to the embodiment of the oscillator circuit 1000. Taking into account that no special reference voltage generation and no complex reference current generation is required, the overall area of the oscillator circuit 10 is still smaller, even if no high ohm/square resistor is available.

Power supply variations are cancelled out in the design of the oscillator circuit 10 because the reference voltage VREF and the current for charging the capacitor 110 are both depending on the first voltage potential VDDA. If the voltage potential VDDA has a higher value, the current charging the capacitor 110 will be higher, but also the reference voltage VREF increases its value about the same percentage so that the output frequency of the output signal OUT, OUTB of the oscillator circuit is in the first order independent from the voltage potential VDDA.

The aging of the oscillator circuit 10 is better, i.e lower, compared to the embodiment of the oscillator circuit 1000 because no current sources are used in the design. Aging of the current sources changes the slope of the voltage potentials VC1 and VC2 of the oscillator circuit 1000 which leads to a frequency change. The time constant of the oscillator circuit 10 depends only on passive components. The aging of passive components is lower compared to active components. The flicker noise of the current sources in the embodiment of the oscillator circuit 1000 will degrade the cycle-to-cycle jitter. By contrast, the oscillator circuit 10 has only passive components having no flicker noise and therefore achieves a better performance.

The absolute value of the output frequency of the output signals OUT, OUTB depends on the value of the reference voltage VREF, the resistances of the resistors 130, 150 and the capacitance of the capacitor 200. Trimming the capacitor 110 enables to compensate variations of the level of the reference voltage VREF and variations of the capacitance of the capacitor 110 and respective resistances of the resistors 130, 150 caused by process variations and thus enables a correct setting of the output frequency.

Figure 5:
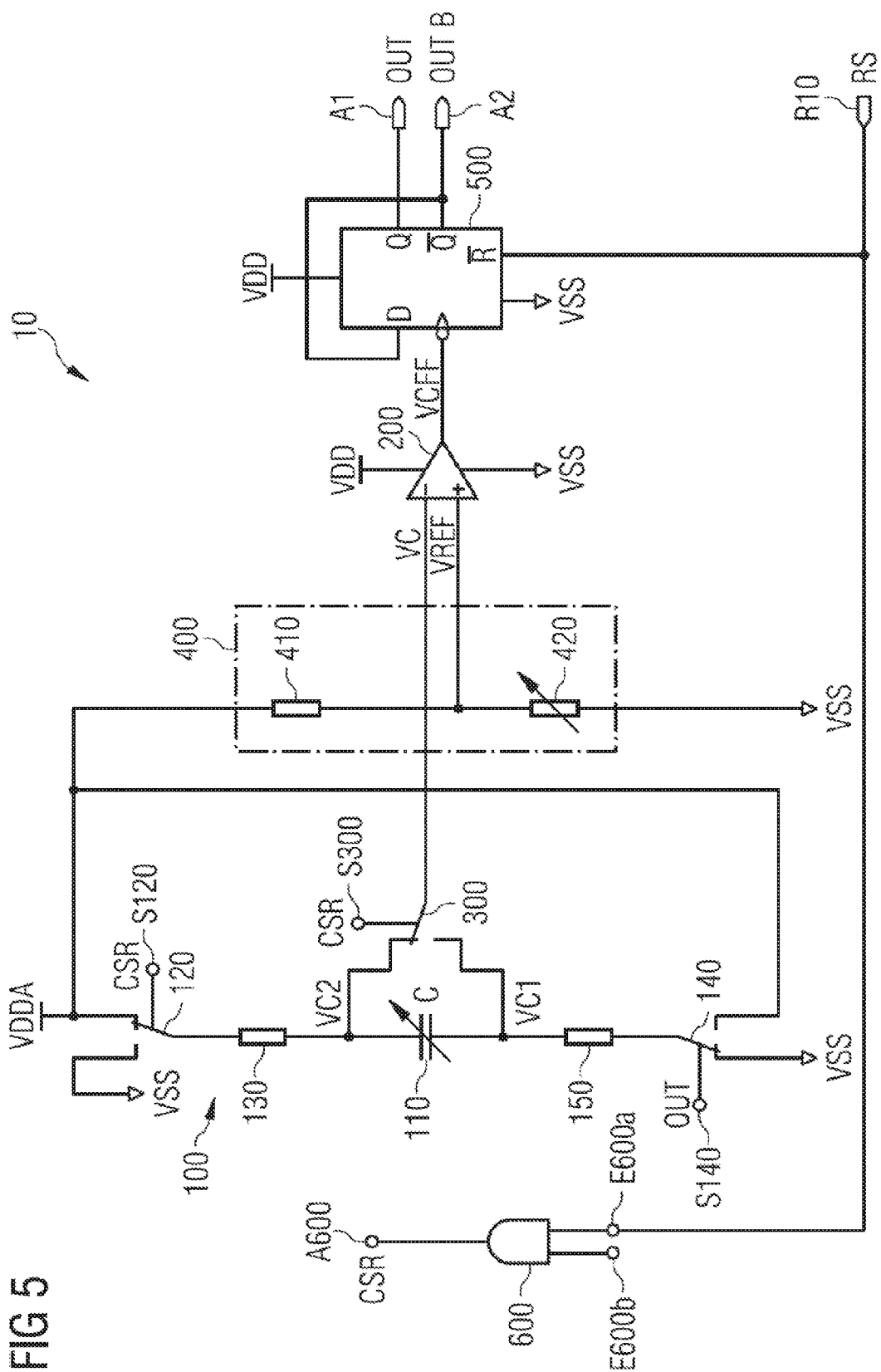
FIG. 5 shows another embodiment of an oscillator circuit.

It is also possible to provide other components such at least one of the resistors as components with a trimmable resistance. It is, for example, possible to trim the resistors 130, 150 or trim the resistors 130, 150 and the capacitor 110 to adjust the output frequency to its correct value. If the resistors 130, 150 are involved in the trimming of the output frequency, both resistors 130, 150 must be trimmed in the same way to avoid duty cycle changes of the oscillator output. FIG. 5 shows an exemplary embodiment of the oscillator circuit 10, wherein the capacitor 110 and the resistor 420 are configured as trimmable components.

A temperature drift of the output frequency of the oscillator circuit depends on the respective temperature coefficient of the resistors 130, 150, the capacitor 110 and the temperature drift of the propagation delay of the comparator 200. The temperature coefficient of the capacitor 110 is very small in modern CMOS processes. A carefully designed comparator 200 will have, in the first order, a constant propagation delay over temperature. Thus, the temperature coefficient of the resistors 130, 150 has a major impact on the circuit. In some advanced CMOS process options resistors with a very low temperature coefficient are available. If this is the case, the overall temperature drift of the oscillator circuit 10 is a combination of all three temperature coefficients explained above, and the oscillator circuit shows a good performance regarding its temperature drift without trimming the temperature coefficient.

According to another embodiment of the oscillator circuit, first ones of the resistors of the oscillator circuit may have another temperature coefficient than second ones of the resistors of the oscillator circuit. In state of the art CMOS processes two resistor modules are usually available, one having a positive temperature coefficient and one having a negative temperature coefficient. In order to compensate the temperature drift of the resistors of the oscillator circuit, at least one of the first resistor 130 and the second resistor 150 and the first and the second resistor 410, 420 of the voltage divider circuit 400 has an opposite temperature coefficient in comparison to the remaining other ones of the first resistor 130 and the second resistor 150 and the first and the second resistor 410, 420 of the voltage divider circuit 400.

FIG. 6 shows an embodiment of the voltage generating circuit 400 comprising resistors 410, 420 and 430 connected between the first supply terminal VD to apply the first voltage potential VDDA and the second supply terminal VS to apply the second voltage potential VSS. In order to compensate the temperature drift of the resistors 130, 150, 410 and 430 the resistor 420 may have a temperature coefficient which is different from the temperature coefficient of the resistors 130, 150, 410 and 430. The resistors 130, 150, 410 and 430 may, for example, have together the same/a different value as the resistor 420 and a positive temperature coefficient, whereas the resistor 420 may have a temperature coefficient in the opposite direction, i.e. a negative temperature coefficient.

According to the design of the voltage generating circuit 400 shown in FIG. 6, the resistor 420 having the temperature coefficient in the opposite direction as compared to the resistors 130, 150, 410, 430 is configured as a resistor having a trimmable resistance. The resistor tape of resistor 420 with the lowest overall temperature drift of the oscillator may be used to generate the reference voltage VREF and is connected to the input terminal I200b of the comparator 200.

As explained above, two resistor modules are usually available in CMOS processes having different temperature coefficients. Normally, the two resistor modules also have different resistivity which leads to a different ohm/square parameter for the resistors. To save area and power, the resistor with the higher ohm/square value may be used for the resistors 130, 150 and the resistors 410, 430.

As shown in FIG. 5, it is possible to adjust the output frequency of the oscillator circuit 10 by trimming the reference voltage VREF by means of the trimmable resistor 420. Changing the level of the reference voltage VREF by adjusting the resistance of resistor 420 changes the oscillator output frequency. This works well when resistors with a low temperature coefficient are available. If the process does not have such elements, a voltage generating circuit 400 to generate the reference voltage VREF as shown in FIG. 6 may be used to adjust the temperature drift of the oscillator circuit. To trim the oscillator circuit in the correct way, the temperature drift is trimmed first, because this also leads to a frequency change of the oscillator output due to a change of the value of the reference voltage VREF. In a second step of the trimming process the absolute value of the output frequency is trimmed by trimming the capacitor 110 and/or the resistors 130, 150.

Many modifications and other embodiments set forth herein will come to mind to one skilled in the art to which the embodiments pertain having the benefit of the teachings presented in the foregoing descriptions and the associated drawings. Therefore, it is to be understood that the description and the claims are not to be limited to the specific embodiments disclosed and that modifications and other embodiments are intended to be included within the scope of the appended claims. It is intended that embodiments cover the modifications and variations of the embodiments provided they come within the scope of the appended claims and their equivalents. Although specific terms are employed herein, they are used in a generic and descriptive sense only and not for purposes of limitation.

The invention claimed is:

1. An oscillator circuit, comprising:
    at least a first supply terminal to apply a first voltage potential,
    at least a second supply terminal to apply a second voltage potential being different from the first voltage potential,
    an output terminal to output an output signal of the oscillator circuit,
    a terminal to apply a reference voltage,
    a capacitor having a first side and a second side, wherein each of the first and second side of the capacitor is selectively connectable to the at least one first or second supply terminal, a comparator having a first input terminal to apply a first input signal, a second input terminal to apply a second input signal and an output terminal to generate a comparator output signal,
wherein the first input terminal of the comparator is selectively connectable to the first or the second side of the capacitor and wherein the second input terminal of the comparator is connected to the terminal to apply the reference voltage,
wherein the comparator is configured to generate the comparator output signal in dependence on the comparing of the first and second input signal of the comparator,
wherein the output terminal of the comparator is coupled to the output terminal of the oscillator,
a first controllable switch being coupled to the first side of the capacitor,
wherein the first controllable switch is configured to selectively couple the first side of the capacitor to the at least one first or second supply terminal, and
a first resistor being arranged between the first side of the capacitor and the first controllable switch.

2. The oscillator circuit as claimed in claim 1, comprising:
a second controllable switch being coupled to the second side of the capacitor,
wherein the second controllable switch is configured to selectively couple the second side of the capacitor to the at least one first or second supply terminal.

3. The oscillator circuit as claimed in claim 2, comprising:
a second resistor being arranged between the second side of the capacitor and the second controllable switch.

4. The oscillator circuit as claimed in claim 1,
wherein the capacitor has a first plate and a second plate being separated from each other to store a charge in the capacitor,
wherein the first side of the capacitor is connected to the first plate of the capacitor,
wherein the second side of the capacitor is connected to the second plate of the capacitor.

5. The oscillator circuit as claimed in claim 2, comprising:
a third controllable switch being connected to the first input terminal of the comparator,
wherein the third controllable switch is configured to selectively couple the first or the second side of the capacitor to the first input terminal of the comparator.

6. The oscillator circuit as claimed in claim 1, comprising:
a voltage generating circuit to generate the reference voltage,
wherein the voltage generating circuit is configured to generate the reference voltage in dependence on the first voltage potential.

7. The oscillator circuit as claimed in claim 6,
wherein the voltage generating circuit is arranged between the at least one first supply terminal and the at least one second supply terminal,
wherein the voltage generating circuit is configured as a voltage divider circuit.

8. The oscillator circuit as claimed in claim 7, comprising:
a first resistor being arranged between the first side of the capacitor and the first controllable switch,
a second resistor being arranged between the second side of the capacitor and the second controllable switch,
wherein the voltage divider circuit comprises at least a first resistor and a second resistor,
wherein at least one of the first resistor and the second resistor and the first and the second resistor of the voltage divider circuit has an opposite temperature coefficient in comparison to other ones of the first resistor and the second resistor and the first and the second resistor of the voltage divider circuit.

9. The oscillator circuit as claimed in claim 1,
wherein the capacitor is configured as having a trimmable capacitance.

10. The oscillator circuit as claimed in claim 8,
wherein at least one of the first and second resistor of the voltage divider is configured as having a trimmable resistance.

11. The oscillator circuit as claimed in one of claims 2 to 10,
wherein at least one of the first and the second resistors is configured as having a trimmable resistance.

12. The oscillator circuit as claimed in claim 1, comprising:
a flip flop circuit to generate the output signal of the oscillator,
wherein the flip flop circuit is arranged between the comparator and the output terminal of the oscillator.

13. The oscillator circuit as claimed in claim 1,
wherein the at least one first supply terminal is configured to apply a positive voltage potential,
wherein the at least one second supply terminal is configured to apply a negative voltage potential.

* * * * *